United States Patent [19]

Horst

[11] Patent Number: 5,203,005

[45] Date of Patent: Apr. 13, 1993

[54] CELL STRUCTURE FOR LINEAR ARRAY WAFER SCALE INTEGRATION ARCHITECTURE WITH CAPABILITY TO OPEN BOUNDARY I/O BUS WITHOUT NEIGHBOR ACKNOWLEDGEMENT

[76] Inventor: Robert W. Horst, 2804 Robeson Park Dr., Champaign, Ill. 61821

[21] Appl. No.: 346,203

[22] Filed: May 2, 1989

[51] Int. Cl.$^5$ .......................................... G06F 13/14
[52] U.S. Cl. ..................... 395/800; 364/232.8; 364/267.8; 364/268.3; 364/269.2; 364/949.4; 364/949.91; 364/942.6; 364/925.5; 364/927.8; 364/DIG. 1; 395/325
[58] Field of Search ... 364/200 MS File, 900 MS File; 395/800, 325

[56] References Cited

U.S. PATENT DOCUMENTS

| | | | |
|---|---|---|---|
| 3,913,072 | 10/1975 | Catt | 395/800 |
| 4,038,648 | 7/1977 | Chesley | 340/173 R |
| 4,471,483 | 9/1984 | Chamberlain | 371/219.1 |
| 4,489,397 | 12/1984 | Lee | 395/800 |
| 4,493,055 | 1/1985 | Osman | 365/78 |
| 4,517,659 | 5/1985 | Chamberlain | 395/800 |
| 4,519,035 | 5/1985 | Chamberlain | 364/200 |
| 4,910,665 | 3/1990 | Mattheyes et al. | 364/200 |
| 4,928,022 | 5/1990 | Marum | 307/241 |
| 4,943,946 | 7/1990 | Brent | 365/189.12 |
| 5,031,139 | 7/1991 | Sinclair | 364/900 |
| 5,058,001 | 10/1991 | Li | 364/200 |
| 5,068,823 | 11/1991 | Robinson | 395/500 |
| 5,072,424 | 12/1991 | Brent et al. | 365/189.01 |
| 5,084,838 | 1/1992 | Kajimoto et al. | 365/63 |

FOREIGN PATENT DOCUMENTS 2128381 4/1984 United Kingdom .

OTHER PUBLICATIONS

"Chip Frame" Scheme for Reconfigurable Mesh-Connected Arrays, P. D. Franzon & S. K. Tewksbury, Proc. IFIP Int'l Workshop on WSI, 1987, 10 pages (unnumbered).
A Review of Fault-Tolerant Techniques for the Enhancement of Integrated Circuit Yield, Will Moore, Proceedings of the IEEE, vol. 74, May 1986, pp. 684-698.
A WSI Approach Towards Defect/Fault-Tolerant Reconfigurable Serial Systems, Wei Chin, John Mavor, Peter B. Denyer, and David Renshaw, IEEE Journal of Solid State Circuits, vol. 23, No. 3, Jun., 1988, pp. 639-646.
WSI-The Challenge of the Future, Proceedings IEEE Conference on VLSI and Computers, May, 1987, pp. 531-542.
Systolic System Processing Systems, edited by Earl E. Swartzlander, Jr., (Marcel Dekker, Inc., New York), 1987, pp. 299-326.
Architectures, M. J. Schute and P. E. Osman (Adam Hilger, 1986), Chapter 4.4, pp. 169-178, "Cobweb-A Reduction Architecture".

(List continued on next page.)

Primary Examiner—Thomas C. Lee
Assistant Examiner—Ken S. Kim
Attorney, Agent, or Firm—Townsend and Townsend

[57] ABSTRACT

A cell architecture for use in a linear array wafer scale integration includes a plurality of multiplexers, each associated with a boundary of the cell, and each selectively operable to permit ingress to and egress from function logic of the cell by neighboring cells Each multiplexer is configured to receive and select between input and output busses from and to a neighbor cell adjacent the associated boundary. The output of each multiplexer connects to the output bus of the boundary adjacent to that with which the multiplexer is associated. When such cell architecture is used in wafer scale integration, oriented so that opposing sides of each cell are rotated 180 degrees relative to any cell at any boundary, the multiplexers can be configured to form a linear array of cells that ensures a fixed, known delay from function logic to function logic of the cells.

7 Claims, 3 Drawing Sheets

OTHER PUBLICATIONS

Wafer Scale Integration, G. Saucier and J. Trilhe (Editors), Elsevir Science Publishers, 1986, pp. 255-270, "Switch Design for Soft Configurable SWI Systems" by Manolis G. H. Katevenis et al.

Asynchronous and Clocked Control Structures for VLSI-Based Interconnection Networks, Mark A. Franklin and Donald F. Wann, Proceedings, 9th Symposium on Computer Architecture, Apr., 1982, pp. 50-59.

An Approach to Highly Integrated, Computer-Maintained Cellular Arrays, Frank B. Manning, IEEE Transactions on Computers, vol. C-26, Jun., 1977, pp. 536-552.

Wafer Scale Integration and Two-Level Pipelined Implementations of Systolic Arrays, H. T. Kung and Monica S. Lam, "Journal of Parallel and Distributed Computing," 1984, pp. 32-63.

Brighter Prospects for Wafer Scale Integration, Roger Dettmer, "Electronics and Power," Apr., 1986, pp. 283-288.

200Mb Wafer Memory, Neal MacDonald, Gordon Neisch, Allan Sinclair, et al., 1989 IEEE International Solid-State Circuits Conference Digest of Technical Papers, pp. 240-241 (Feb. 1989).

CELL STRUCTURE FOR LINEAR ARRAY WAFER SCALE INTEGRATION ARCHITECTURE WITH CAPABILITY TO OPEN BOUNDARY I/O BUS WITHOUT NEIGHBOR ACKNOWLEDGEMENT

BACKGROUND OF THE INVENTION

This invention is directed to an architecture for interconnecting an array, and in particular to use of that architecture to construct a linear array from a wafer scale integrated array of substantially identically formed cells.

Since commercial introduction of integrated circuitry, there has been a continuing trend toward putting more and more circuitry onto smaller and smaller areas of integrated circuit chips. One reason for this trend is to reduce the number of chip-to-chip connections which tend to reduce circuit speed, introduce noise, and often cause reliability problems due to mechanical failure. Another reason is the requirement for driver circuits when signals are brought off-chip—at the expense of circuit area. There are also economic considerations: A system developed from multiple chips encounters higher packaging and manufacturing costs than if implemented in fewer (or, ideally, one) chips.

On the other hand, as the circuit size increases, fabrication flaws tend to reduce the yield of useable circuits from a wafer.

It is not too surprising, therefore, to see that very large scale integration (VLSI) is turning to wafer scale integration, as a response to the increasing demand for higher integrated circuit density. Wafer scale integration provides a large density advantage over VLSI.

Wafer scale integration seeks to assemble an entire system on a single wafer, rather than partition the wafer into chips that each carry smaller portions of a system, and thereby requires the expense of individual packaging. However, yield has been one problem that works against successful wafer scale integration. Fabrication flaws must be overcome in order to effectively and economically use wafer scale integration techniques.

There are a number of wafer scale techniques known today aimed at overcoming the yield problem. One such technique utilizes redundant copies of a digital system formed on a wafer, and provides selection circuitry integrated in each of the systems. The selection circuitry intercouples portions of each copy of the system in a manner that results in one, flaw-free, working version of the desired digital system. An example of this technique can be seen in U.S. Pat. No. 4,621,201.

Another approach, and one to which the present invention is directed, involves forming a multiplicity of substantially identical circuits or cells on a wafer. Each cell contains logic for performing one or more functions (e.g., arithmetic and/or logic functions, memory functions, or any combination of these and other functions). Various techniques are then used for interconnecting these cells.

Among the different connection techniques known today are (1) imbedding the cells in a sea of switches to interconnect them in various fashions (i.e., to form 2-D meshes, linear arrays, tree configuration, and the like) using fuses or switches that are set during manufacture; or (2) interconnecting the cells with crossbar switches, connecting every pair of cells. Examples of these kinds of wafer scale integration formations can be seen in W. R. Moore, "A Review of Fault Tolerant Techniques for the Enhancement of Integrated Circuit Yield," *Proc. of the IEEE*, Vol. 74, May, 1986, pp. 684-698; W. Chen, et al., "A WSI Approach Towards Defect/Fault Tolerant Reconfigurable Serial Systems," *IEEE Journal of Solid State Circuits*, Vol. 23, Jun., 1988, pp. 639-646; J. Trilhe and G. Saucier, "WSI—The Challenge of the Future"; *Proc. IEEE Conference on VLSI and Computers*, May, 1987, these interconnecting techniques can tend to use more wafer area, create more complex circuitry, and pose a routing problem for signal lines.

Yet another, more simplified approach, is to have bidirectional busses connecting each rectangular cell to its four adjacent neighbors. The input to the cell is selected from one of the four neighbors, and the output driven to a different neighbor. The main problem with such a structure is that every cell must have two operating neighbor cells in order to be included in a linear array or "chain" of such cells. Also, it is difficult to configure a chain in such a way that both the beginning and end are on a wafer periphery where they may be connected to bonding pads.

A more practical cell interconnection approach has been to provide separate inputs and outputs between a cell and each of its neighbors to increase interconnection flexibility. In this approach, the cell carries a logic function whose input may be selected from any one of the four neighbors, and whose output is, in turn, communicated to the selection logic associated with each boundary (which also receives inputs from each of the other boundaries). Although this structure provides sufficient paths to connect around many defective cells, there are several drawbacks: The delay between the logic functions of any two cells depends upon the number of individual selection logic elements between them. Since this is not known at the outset, the delay is unbounded. Also, the amount of logic to implement the selection logic (e.g., multiplexers) may take up a significant area of the cell, and particularly so when the information is communicated in parallel instead of bit serial form. Further, the routing of the necessary signal lines tends to be irregular and confused; since every side must connect to every other side, it is possible that interference with logic routing lines will be encountered. Further still, it is difficult to find an acceptable configuration algorithm that allows connection to any reachable cell. This and similar structures are discussed in T. Leighton and C. E. Leiserson, "Algorithms for Integrating Wafer Scale Systolic Arrays," *Systolic Signal Processing Systems*, Dekker, 1987, pp. 299-326; M. J. Shute and P. E. Osman, "COBWEB-A Reduction Architecture," *Wafer Scale Integration*; Adam Hilger, 1986, pp. 169-178; and M. G. H. Katevenis and M. G. Blatt, "Switch Design for Soft-Configurable WSI Systems"; *Proc. IFIP Int'l Workshop on WSI*, Elsevier Science Publishers, 1986, pp. 255-270.

A modification of the foregoing approach is implemented in a wafer-scale integrated memory system. Each cell carries a pair of shift registers that are used, when connected to neighbor cells, to form a spiral, consisting of a single, long shift register chain. The first half of the path through the shift register chain is formed by one of the shift registers of each cell; the return path contains the second shift register of each cell. There are two inputs to the cell from each neighbor cell; one input (from each neighbor) is multiplexed to the input of one of the shift registers, the other input (from each boundary) to the other shift register. In similar fashion the outputs of each shift register are multiplexed to one of two outputs to each neighbor. While this scheme may simplify the multiplex circuitry used in the connection techniques discussed above, it still requires more than is believed needed. Further, known implementations of the approach use a cell-to-cell connection scheme that lacks flexibility, resulting, it is believed, in a less than optimum harvest of those cells available for inclusion in the chain. (As used herein, "harvest" is used to refer to those cells that are actually included in any interconnection of the cells, relative to the number of cells on the wafer that operable.) An example of this approach is found in U.S. Pat. No. 3,913,072.

There have been also approaches that have amplified the aforementioned basic structure adding connections to additional neighbors (hexagonal arrays—see M. J. Shute supra) or neighbors that are not edge-adjacent (i.e., corner neighbors) These designs, however, tend to suffer from the same general problems as the rectangular approach, both offer some increased harvest at the expense of extra cell area and layout difficulties.

SUMMARY OF THE INVENTION

The present invention provides a simplified architecture that is adaptable for use in connecting an array of digital systems to form therefrom a linear array of such systems. The invention is particularly applicable for use in wafer scale integration having formed thereon an array of cells, interconnecting the cells in a linear array. When used in wafer scale integration, the architecture uses interconnection or configuration logic implemented in less circuitry, and thereby uses less wafer space, than presently known.

According to a preferred implementation of the present invention, when used in connection with a wafer scale integration of an array of cells, each cell is identically structured, and has N boundaries. Each boundary is provided with an input and an output bus structure for respectively receiving signals from, and providing signals to, the neighbor cell adjacent the boundary. Configuration logic, including N selection circuits, one for 14 each boundary, provides a pair of inputs coupled to receive and select between the input and output bus structures of the boundary. N−1 of the selection circuits operate to communicate the selection to the output bus structure of the boundary adjacent that with which the selection circuitry is associated. The remaining (Nth) selection circuit communicates its selection input to a logic function circuit which contains the functional logic of the cell. The output of the logic function circuit connects to the output bus structure of the adjacent boundary.

The logic function circuit includes control for each of the selection circuits, receiving signaling from each of the adjacent cells to, in effect, open that cell to such adjacent cell.

The cell architecture of the present invention is preferably oriented, when used to form a wafer scale integrated circuit, so that the cells are arranged with their opposite sides rotated 180 degrees relative to any adjacent cell. A simple configuration algorithm is then used to logically connect the logic functions of the cells to one another using the selection circuits, in a linear array.

In the preferred embodiment of the invention, each cell is formed on the wafer so that it is generally rectangular in shape, thereby providing each cell with four boundaries and four neighbors (except those at the periphery of the wafer). Associated with each boundary is a two-to-one multiplexer that is connected to receive the input bus from, and the output bus to, the cell at the associated boundary. Three of the multiplexers have their respective outputs connected to the output bus of the adjacent boundary clockwise from that of the multiplexer. The output of the fourth multiplexers is also coupled to the adjacent output bus, but via the function logic carried by the cell.

The configuration logic of each cell, upon power-up, places the multiplexers in a selection mode that forms a closed-loop data path. Access to any cell can be initiated by any neighbor cell by asserting an OPEN signal, causing the multiplexer associated with the boundary to the neighbor to select the corresponding input bus. Once access is made, the circuitry contained by the cell may be tested, and that cell then used to gain access to one of its neighbors. In this manner a linear array or chain of cells is formed.

A number of advantages flow from the cell architecture of the present invention First, as indicated above, the circuit delay from cell to cell (or more accurately, from function logic of any one cell to the function logic of an immediately adjacent cell in any formed chain) is no longer unbounded; it is essentially four multiplexer delays per function logic.

In addition, the cell architecture of the present invention reduces the amount of logic in the signal path of the chain by being able to use a more simplified multiplexer than that proposed by the prior art. The present cell architecture requires only a two-input multiplexer, whereas prior art techniques have often proposed five-input multiplexers (for a four boundary cell) and more inputs are needed When additional boundaries are proposed.

Intercell connections are less complex with the cell architecture of the present invention, resulting in less signal lines (for signal communication) and more simplified circuit layouts.

Linear array configuration using the architecture of the present invention is greatly simplified.

These and other aspects and advantages of the present invention will be readily appreciated by those skilled in the art upon reading of the following description of the preferred embodiment, which should be taken in conjunction with the accompanying drawings.

BRIEF DESCRIPTION OF THE DRAWINGS

FIG. 4C is a flow chart illustrating in simplified form, the major steps taken to configure a linear array of cells constructed in accordance with the teachings of the present invention;

DESCRIPTION OF THE PREFERRED EMBODIMENT CELL ARCHITECTURE

Figure 1:
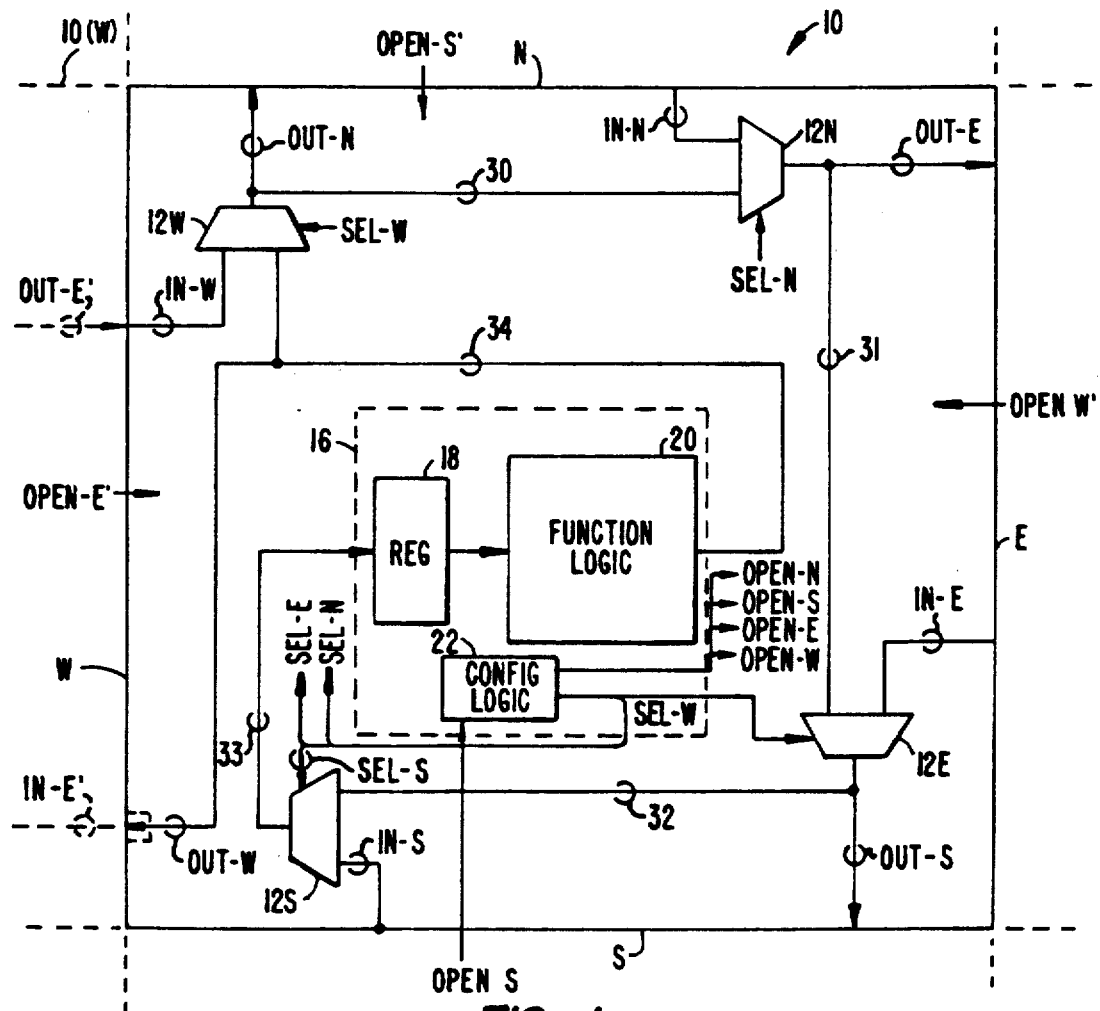
FIG. 1 is a simplified block diagram of the cell architecture of the present invention.

Turning now to the Figures, and for the moment specifically FIG. 1, there is illustrated in simplified, block diagram form a cell, designated generally with the reference numeral 10, constructed in accordance with the teachings of the present invention. As illustrated, the cell 10 is rectangular in shape, having four boundaries labeled North (N), West (W), South (S), and East (E). (As used here "boundaries" refers to the edge portions of the periphery of a cell shared with a neighbor cell.) Associated with each of the boundaries N, W, S and E are 2-to-1 multiplexers 12N, 12W, 12S, and 12E respectively. Also associated with each of boundaries N, . . . E are input and output busses IN-X and OUT-X, respectively (where X is the designation of the particular boundary N, . . . E). Each of the IN and OUT busses of the cell 10 connect to a corresponding OUT and IN bus of an adjacent cell. Thus, for example, the cell 10W, partially indicated in phantom on the boundary E of cell 10 has its corresponding output and input busses (located at what would be boundary E of the cell 10W), OUT-E' and IN-E' respectively connected to the IN-W and OUT-W busses of the cell 10. That is, the OUT and IN buses of a cell correspond to the IN and OUT buses, respectively, of a neighbor cell at any one boundary.

It should be noted at this point that the IN and OUT busses can be structured to convey information in bit-serial format or multi-bit format. The advantages of the present invention permit information to be conveyed in parallel, multi-bit format and, therefore, this format is preferred to the bit-serial transfer of information.

The input and output busses associated with each of the boundaries N, . . . E are coupled to a corresponding one of the inputs of the multiplexer 12 associated with that boundary. Thus, for example, the input and output busses IN-W and OUT-W associated with boundary W connect to corresponding inputs of the multiplexer 12W also associated with the boundary.

As FIG. 1 further illustrates, the outputs of the multiplexers associated with three of the cell boundaries (W, N and E) connect directly to the output bus of an adjacent boundary and, therefore, to one of the inputs of the multiplexer 12 associated with that adjacent boundary. The remaining multiplexer output, here multiplexer 12S, connects to the output bus OUT-W via a logic circuit 16, which is shown as including a pipeline register configuration 18, function logic 20, and configuration logic 22. As shown, the output of the multiplexer 12S is communicated to an input of the pipeline register configuration 18, from there to function logic 20. The output of the function logic 20 is then coupled to the output bus OUT-W of the boundary W and, as a consequence, to an input of the multiplexer 12W associated with the boundary W.

Figure 5:
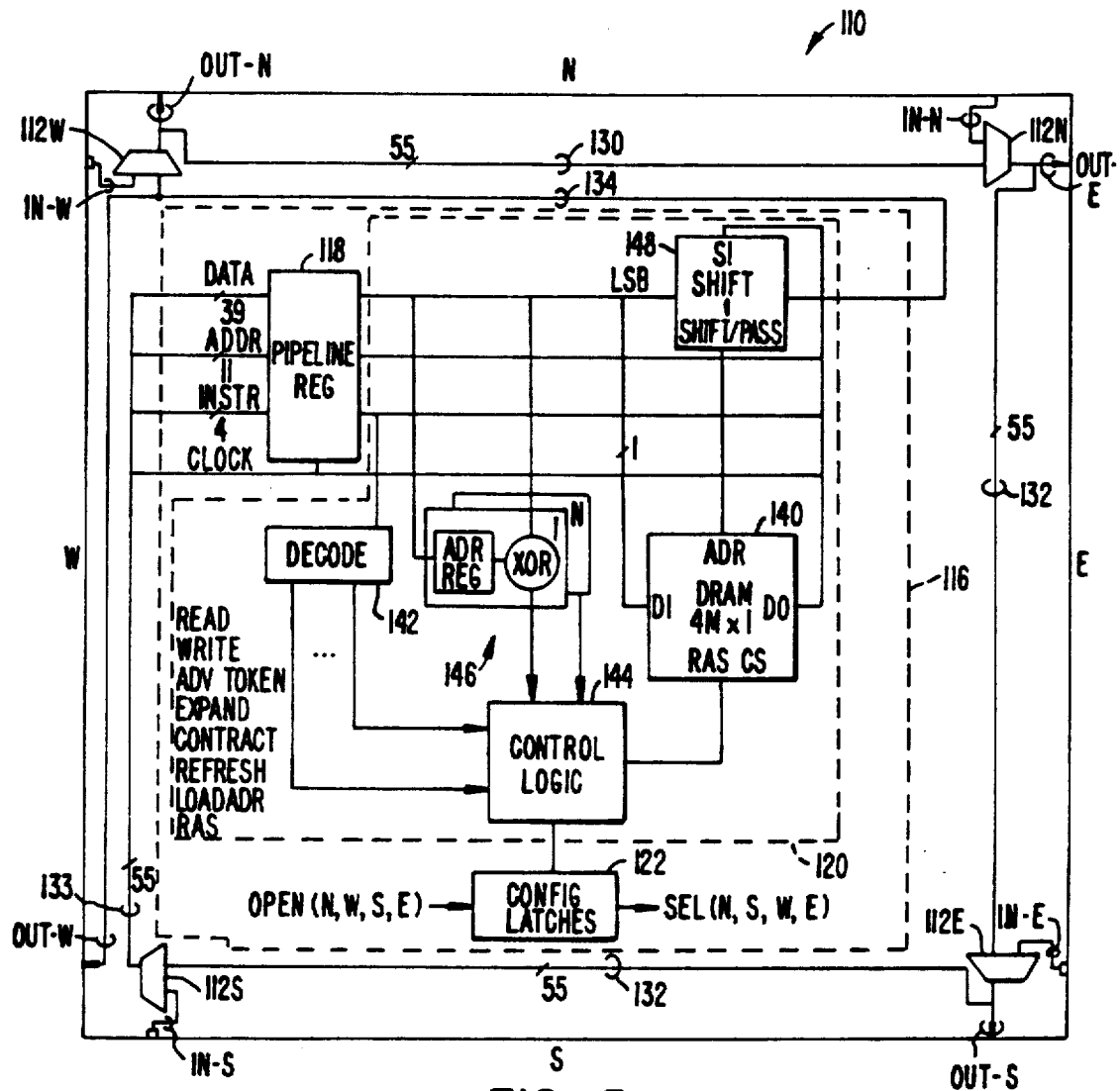
FIG. 5 illustrates use of the present invention in combination with a memory system.

The function logic 20 contains the logic function or functions to be implemented by the particular cell. For example, function logic 20 could take the form of an arithmetic logic unit, a memory device of particular configuration, certain other digital functions, or a combination of any of the foregoing. Set forth below, and illustrated in FIG. 5, is a discussion of function logic 20 in the form of a memory system.

The configuration logic 22, among other things, operates to control the multiplexers 12 via selection signals SEL-W, SEL-S, SEL-E and SEL-N. The configuration logic 22 contains power-on reset circuitry (FIG. 6) of generally conventional design that operates to place the cell 10 in a "closed" state in which the selection signals (SEL) cause the multiplexers 12 to de-select all IN busses. In effect, there is an internal loop formed within the cell 10 by selecting, as inputs to the multiplexers 12, the associated output (OUT) busses. Thus, for example, at power-up, the multiplexer 12N communicates the output bus OUT-N to the output bus OUT-E; the multiplexer 12E communicates the output bus OUT-E to the output bus OUT-S, and so on. The configuration logic 22 also generates four OPEN signals (OPEN-N, E, S, W) that are respectively communicated to the configuration logic of the neighbor cells and the boundaries N, E, S and W of cell 10: and, correspondingly, the neighbor cells each communicate an OPEN signal to the configuration logic 22 of cell 10. The OPEN signal from any cell adjacent the boundaries N, . . . E, of cell 10, when asserted, operates to cause the multiplexer associated with that boundary to select the corresponding input (IN) bus. In addition, the cell asserting the OPEN signal correspondingly causes its multiplexer associated with the intervening boundary to select the OUT bus of the cell receiving the OPEN signal.

For example, if the (incoming) OPEN-N' signal (from the cell adjacent the S boundary of the cell 10) is asserted, the configuration logic 22 will, in turn, assert the SEL-S signal to cause the multiplexer 12S to select the input bus IN-S. At the same time, the cell asserting the OPEN-N' signal, will cause its multiplexer (not shown) associated with its boundary N (boundary S for cell 10) to select as an input the OUT-S' bus of cell 10; that is, the boundary is "opened" both ways between the two cells.

Figure 6:
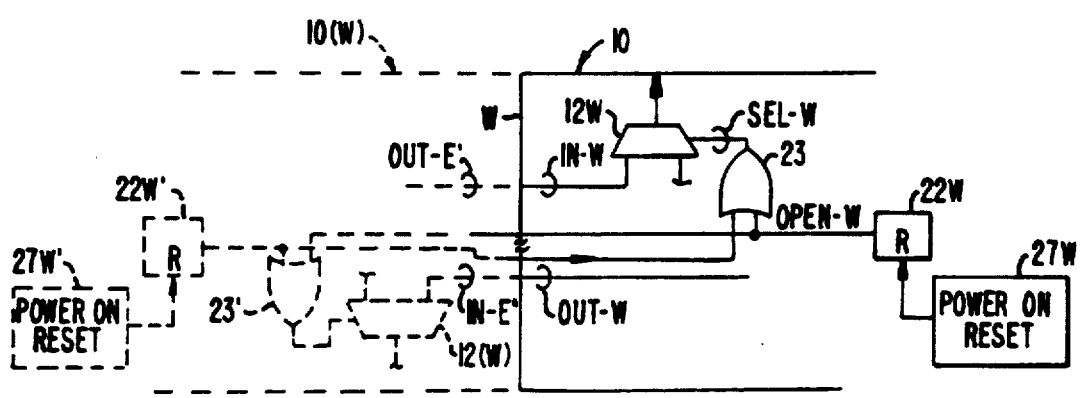
FIG. 6 illustrates the circuitry used to open a boundary between two cells constructed as illustrated in FIG. 1.

Digressing a moment, and referring to FIG. 6, this boundary "opening" concept is worth further description. FIG. 6 illustrates those portions of cell 10, and the cell at its west (W) boundary, here cell 10(W), involved in opening the boundary to one another. Those elements that have already been described in connection with the discussion of FIG. 1 will keep the designations used in that discussion.

As FIG. 6 illustrates, cell 10 includes a latch 22W, contained in the configuration logic 22, that when set asserts the OPEN-W signal communicated to the cell 10(W). Although not specifically shown, it will be understood that other similar latches are used for the OPEN-N, W, and S signals. The OPEN-W signal is coupled to one input of a two-input OR gate 23 on its way to the cell 10(W), where it is applied to another input of a two-input OR gate 23'. In similar fashion, the OPEN-E' from the cell 10(W) emanates from a latch 22W', is coupled to the other input of the OR gate 23' and to the other input of the OR gate 23 of cell 10.

Note that, as FIG. 6 shows, the IN-W bus of cell 10 connects to the OUT-E' bus from cell 10(W), and that the OUT-W bus from cell 10 connects to the IN-E' bus of cell 10(W).

In operation, the cell 10 asserts the OPEN-W signal, to open the boundary W into the cell 10(W), by setting the latch 22W. The OPEN-W signal then operates through the medium of the OR gates 23 and 23' to respectively cause the associated (with the boundary in question) to select their corresponding IN-W and IN-E busses (i.e., OUT-W of cell 10). A path of communication is thereby formed from cell 10 to cell 10(W) (via the OUT-W bus and through the multiplexer 12(W)), and likewise from cell 10(W) to cell 10 (via the OUT-E' and IN-W busses, and through the multiplexer 12W. In similar fashion, were it the cell 10(W) that asserted its OPEN-E' signal, the W boundary between the cells 10(W) and 10 would be opened in the same manner. The boundary is closed when the OPEN-W (or OPEN-E') signals are deasserted.

Before returning to FIG. 1, there is one more aspect of FIG. 6 that warrants discussion. Also illustrated in FIG. 6 is a power-on reset circuit 27W and 27W' carried by each of the cells 10 and 10(W), respectively. As indicated above in connection with the prior discussion of FIG. 1, the power-on reset circuits 27W, 27W' are contained in the configuration logic 22, and function, at the time power is applied to the cell, to reset various latches. One such latch is the latch 22W, 22W'. Thus, when operating power is applied to the cells 10, 10(W), the power-on reset circuits 27W, 27W', whose outputs connect to the reset (R) inputs of the latches 22W, 22W', respectively, operate to reset the latches. In turn, with the latches 22W, 22W' in their reset condition, the associated multiplexers 12W, 12W' have the inputs connected to the IN-W and IN-W' busses de-selected in favor of the remaining inputs, thereby placing the cell in its closed state.

It should be evident that the other multiplexers 12N, 12E, and 12S (FIG. 1) also have circuitry essentially the same as that shown in FIG. 6; i.e., each would have its selection input coupled to receive the output of an OR gate receiving OPEN signals from a latch (not shown, but substantially the same as latch 22W) of cell 10 and the cell at the associated boundary N, E, and S. The output of the power-on circuit 27W would be connected to the reset inputs of such latches (not shown) as connected to latch 22W.

Returning now to FIG. 1, although not specifically shown for reasons of clarity, the OPEN signals generated by the cells at the E, N, and W boundaries of cell 10 (i.e., OPEN-E', N', W') are also communicated to the configuration logic, where they are received by OR gates (not shown) similar to the OR gate 23 (FIG. 6), for performing similar operations on the associated multiplexers 12 when asserted.

The bus structure of the IN and OUT busses, including those that may be termed an "internal bus" (i.e., bus lines 30, 31, 32, 33 and 34) of the cell 10, may be single-bit or multi-bit wide. Preferably, however, as indicated in connection with the discussion of FIG. 5, the bus structure consists of multiple signal lines, so that multibit data and control signals can be communicated in parallel with a clock signal.

CELL ORIENTATION IN WSI ARRAYS

Figure 2:
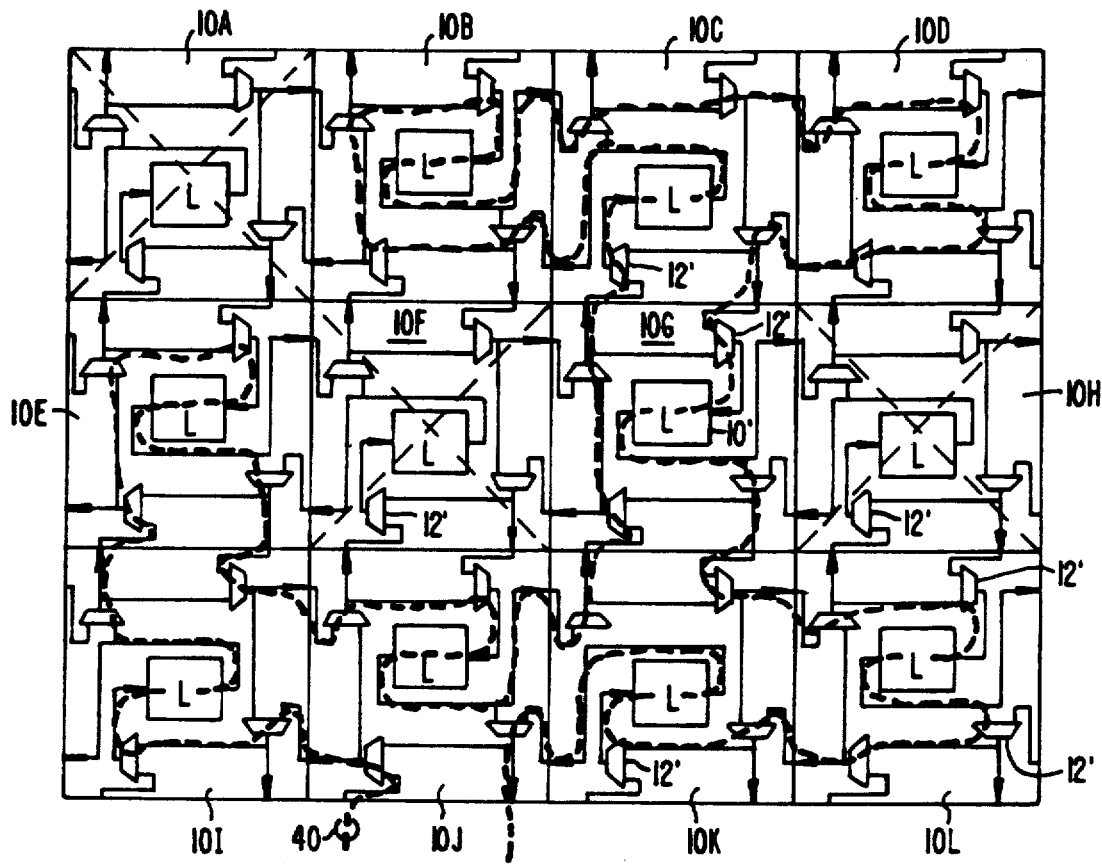
FIG. 2 is an illustration of an array of cells formed according to the teachings of the present invention in wafer scale integration.

The basic architecture presented in FIG. 1 is preferably used to form an array of identical configurations of the cell 10. Each cell, however, is oriented so that it is rotated 180 degrees relative to any neighbor cell. This concept is illustrated in FIG. 2, which shows a three by four array 38 of cells 10 (10A, . . . 10L). The cells 10 are illustrated in more simplified configuration than that of FIG. 1 for the sake of clarity.

As FIG. 2 illustrates, each cell is identically structured, along the lines of the circuit shown in FIG. 1.

Thus, for example, each of the cells 10I, . . . 10L contain four multiplexers 12' and function logic L.

FIG. 2 is presented to illustrate two important aspects of the invention. The first is that when cells are constructed in accordance with the teachings of the present invention to form an array of such cells, there is a preferred orientation of each of the cells, relative to its four principal neighbors (i.e., those neighbors on its north, south, east and west boundaries): Each cell is rotated 180 degrees relative to any adjacent neighbor. For example, referring to cell 10G, note that the multiplexer 12' that drives the function logic L is oriented to be situated in the northeastern corner of the cell. Now, note that, each of the neighboring cells 10C, 10H, 10K or 10F has the corresponding multiplexer 12' (i.e., the multiplexer driving the function logic of that cell) rotated 180 degrees relative to the multiplexer orientation of cell 10G. To put it another way, what was the N, E, S and W borders of the cell 10G become, respectively, the borders S, W, N and W when rotated 180 degrees to form any one of the cells adjacent to the cell 10G.

As will be explained more fully below, the cells of such an array 38 as illustrated in FIG. 2 are logically connected to one another by a configuration algorithm to constructs a single signal path that forms a linear array of the cells—such as indicated, for example, by the dotted line 40 in FIG. 2. As FIG. 2 illustrates, the signal path, or "chain" as it is sometimes called in this art, logically connects the function logic of each of the cells 10 of the chain 40 to one another in serial fashion, using appropriate selection of the multiplexers 12' of each cell. Access to any and all logic circuits 16' is thereby established, once the chain 40 is formed.

This latter point leads to the second important aspect illustrated by FIG. 2: Note that the signal path between any function logic L and the next in the chain 40 includes only four multiplexers 12'; no more, and no less. This aspect of the invention establishes and makes known the signal delay between any two of the function logic in the chain 40: Four multiplexer delays. Prior schemes have used multiplexing configurations that could bypass the function logic of any particular cells so that any number of multiplexers could be interposed between two immediately successive function logic circuits, creating the unbounded situation. This required designers to design to a "worst-case" delay condition, creating much slower array operation. With known delay, array operation can be, by design, much faster.

Before continuing, it should be understood by what is meant when the term "wafer" is used herein. Although the invention is best used for forming a array 38 (FIG. 2) on an entire available surface of a wafer, it may well be that there are times that only a portion of the wafer is used for an array of cells; the remainder of the wafer may contain other circuitry. Thus, as used herein, wafer is meant to refer to a large array of cells 10 formed on the surface of a semiconductor wafer, whether or not that portion is the entire wafer surface.

CLOCKING

Since the function logic L of the cells 10A, . . . , 10L most likely will be synchronous and, therefore, require clock pulses, there are a variety of methods for communicating clock to the various cells. A carefully designed clocking scheme is required to obtain good yield and performance in wafer scale integrated systems. The synchronous approach is most common, but controlling clock skew across an entire wafer is difficult, and the total skew adds directly to the cycle time. Another problem is that the clock must be carefully designed to prevent a single fault on a clock line from disabling a large number of the cells. For example, using a global clocking scheme can result in a loss of a significant number of cells if an unfortunately-located fabrication defect forms. Often, the goals of low skew and fault tolerance are at odds with each other, and compromises must be made. Most proposed schemes use a single master clock, or permit the individual cells to communicate with one another asynchronously, through the use of handshake signals. (See, for example, M. Franklin and D. Wann, "Asynchronous and Clocked Control Structures for VLSI Based Interconnection Networks," *Proc., 9th Symposium on Computer Architecture*, Apr., 1982, pps. 50-59.)

The asynchronous approach eliminates the need for a single controlled skew clock, but substitutes a penalty that may be even worse. A full handshake between two cells requires waiting a two-way propagation delay between the cells. Also, if the cells have internal clocks, there may be additional delays to synchronize signals to clock edges.

A preferred approach for wafer scale integrated linear arrays is to use phase-shifted synchronous clocking similar to that described by F. Manning, "An Approach to Highly Integrated Computer-Maintained Cellular Arrays," *IEEE Trans. Comput.*, Vol. C-26 Jun., 1977, pps. 536-552. Phase-shifted synchronous clocking is based on the premise that most communication transfers take place in a single direction, and the clock can be distributed through the same delay and configuration paths as the data. Accordingly, a diagram of a preferred clocking scheme is illustrated in FIG. 3.

Figure 3:
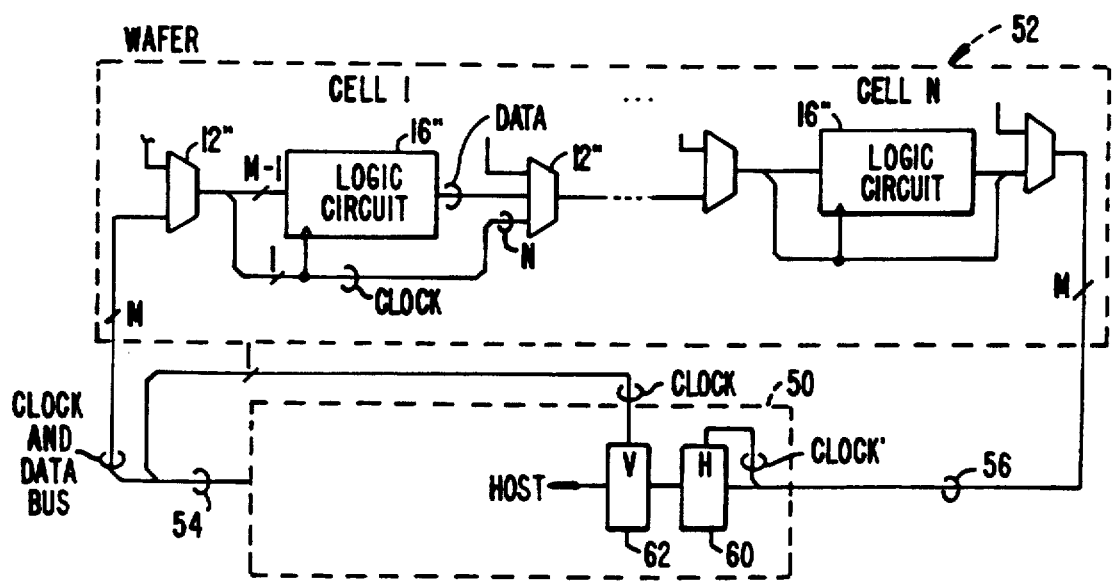
FIG. 3 is a simplified block diagram to illustrate the preferred method of communicating a clock signal to the cells formed in accordance with the teachings of the present invention.

As FIG. 3 illustrates, a host computer 50 generates data and clock signals that are communicated to a wafer 52 on an M-bit-wide bus 54. The wafer 52 is formed to carry an array of cells (cells 1, . . . N) constructed according to the present invention. The clock and data signals are applied to the multiplexer 12" of the first cell of the array, cell 1, and applied to the function logic 16" of that cell. The data from the function logic 16" is coupled to a multiplexer 12" of that cell 1, and selected, along with the clock signal, for communication through the remaining N−1 cells of the wafer 52, and returned to the host system 50 via the return bus 56. At the host, the data is applied to an input register 60 clocked by the clock signal that accompanied the data. The output of the register 60 is applied to a synchronizing register (or registers) 62, clocked by the clock signal (clock) that is applied to the wafer 52 by the input bus 54.

The clock signal therefore, takes the same path through the array of N cells formed on the wafer 52 as that of the data signals. Thus the clock is successively delayed at each cell thereby acquiring a phase shift, relative to the clock at the output of the host 50, that is equal to the delay through the multiplexers 12". However, when returned to the host system 50 from the last cell, N, there is no predictable phase delay between the original host-generated clock (clock) and that received on the return bus 56. Accordingly, the registers 60 and 62 are used to resynchronize the clocks for receiving data by the host system 50 in conventional fashion.

The only potential problem in this scheme is that the clock pulse (clock') width may shrink or grow slightly at each stage if the rise and fall times of the buffers are not identical. A simple solution to the problem is to make the clock multiplexer/buffers inverting. Since there are always four multiplexers between cells, the clock arrives without inversion, and asymmetries in rise and fall times at one cell are cancelled out by the next.

The net effect of the improved architecture plus the phase-shifted clocking is a gain in performance. In prior schemes, the minimum clock period is governed by:

$$t_c \geq t_r + t_1 + t_{SKEW} + N \cdot TMUX_{MAX} \qquad (1)$$

where $t_r$ is the delay time of the (pipeline) register 18 (FIG. 1), $t_1$ is the delay of the function logic 20, $t_{SKEW}$ is the clock skew, and $N \cdot t$ and $N \cdot tMUX_{MAX}$ is the time for N cells of delay through the configuration multiplexers 12". In contrast, using the cell architecture of FIG. 1, and the arrangement of those cells in a linear array as indicated in FIG. 2, the minimum clock period is:

$$t_c \geq t_r + t_1 + 4 \cdot (tMUX_{MAX} - tMUX_{MIN}). \qquad (2)$$

Note that the clock skew term has been eliminated, and the configuration delay has been reduced to four times the time difference between the minimum and maximum paths through the multiplexers. On a large wafer, the savings due to both the skew and the multiplexer delay terms could lead to a significant cycle time improvement.

CONFIGURATION ALGORITHM

As indicated above, a wafer scale integrated array of cells constructed in accordance with the teachings of the present invention can be configured as a single, long chain or linear array, such as that simplistically illustrated in FIG. 2. The chain is formed pursuant to an algorithm which initially locates those cells sufficiently operable to be able to pass data (and clock) and logically connects them in a chain. Generally the algorithm proceeds, on a cell-by-cell basis, along the following lines:

First, a cell is "opened" by asserting the OPEN signal associated with a border of the cell, causing the associated multiplexer to select an IN bus (FIG. 1).

Second, multiplexers 12 and data paths within the newly opened cell are tested, and if found operable, this newly tested cell becomes the new terminus of the chain. If, on the other hand, multiplexers 12 and/or cell data paths are found to not be operable, the border is closed (by deasserting the associated OPEN signal), and another cell is opened and the test of that cell made.

The algorithm continues until the chain returns to the cell at the periphery of the wafer serving as the input/output of that wafer. For example, referring to FIG. 2, assuming the wafer comprises only cells 10A, . . . 10L, and cell 10J serves as the input/output cell, the data path chain formed by the algorithm is illustrated as the dotted line 40. It enters the wafer at the cell 10J, and proceeds sequentially through the cells 10I. 10E back through 10J, and continues through cells 10G. 10B, . . . 10K, returning to the cell 10J where it is taken from the wafer of our example.

The test performed by the algorithm may be limited, as referred to above, to determining whether the cell has the data-communicating ability (i.e., workable multiplexers and data paths) to be included in the chain. Once the chain is formed, a second testing procedure can be made to determine the operability of the other logic circuitry (e.g., the pipeline registers 18 and function logic 20). Alternatively, the initial cell test could be to determine the working condition of the entire cell.

Figures 4A, 4B:
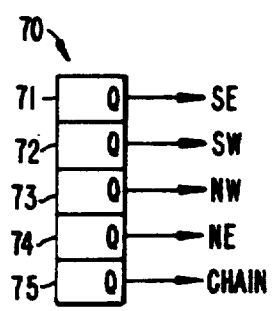
FIG. 4A illustrates configuration latches used in the present invention.
FIG. 4B is a diagrammatic array of four cells constructed in accordance with the present invention to illustrate sequential logic interconnection of cells by a simple configuration algorithm.

Before going into the configuration algorithm in more depth, there are additional features of the cell 10 used in configuring the chain which need explanation. Contained in the configuration logic 22 (FIG. 1) are various registers and latches that are set or reset to indicate various operating states, modes of operation, etc. One such bank of latches is illustrated in FIG. 4A at 70, comprising individual latches 71-75. The information provided by these latches 71-75 is as follows. The stage 75, when set, results in assertion of the CHAIN signal to indicate that the particular cell is a part of the chain. A cell is not opened if this signal is asserted.

When each cell is opened, tested, and found to be operable, it forms the head of the developing chain, signified by a "token" being "advanced" (e.g., moved) into that newly tested cell by setting one of the latches 71-74. The token indicates which border of the cell brought the chain in, and also indicates the border to be checked for progression of the chain into a neighbor (i.e., the adjacent border, in a clockwise direction, from the entry border). The signals SE, SW, NW and NE are mutually exclusive in that only one, if any at all, is asserted at any one time. The asserted signal will indicate the particular corner of the cell that is (1) bordered by the boundary crossed by the chain for ingress to the cell and (2) the first boundary to be checked for the next cell selected for progression of the chain. These latches are cleared by the power-up circuit (not shown) contained in the configuration logic 22 (FIG. 1).

One final point: Advancing the token does not necessarily mean that the chain, as it is constructed, will always proceed from a newly-tested cell into an untested cell. Rather, the token could well be advanced into an already tested cell, such as indicated in FIG. 2 where path 40 is shown beginning at cell 10J, proceeding through cell, 10I and into cell 10E. Cell 10E is, however, bounded by the wafer periphery, and two inoperable cells 10A and 10F (so indicated by the Xs drawn thereacross in phantom). The algorithm, as will be seen, checks first to see if the "target⇌ cell (i.e., the cell next in line for possible inclusion in the chain) is, in fact already a part of the chain, and if the boundary between them (the target cell and the newly tested cell, presently holding the token) is open (when a boundary is opened, it is opened both ways). If so, the token is advanced into the target cell, even though it is already in the chain. This is the case shown in FIG. 2, where the path 40 returns from the cell 10E to cell 10I, and from there to cell 10J. There are other instances of this concept shown in FIG. 2.

The configuration algorithm, the main steps of which are illustrated in FIG. 4C, proceeds along the following lines: The wafer is powered-up (i.e., power applied), causing the bank of latches 70 of each of the cells 10 carried by the wafer to be reset; thereby, the signals SE, SW, NW, NE, and CHAIN are deasserted. Referring to FIG. 4C, the algorithm next proceeds to the step 80, where a periphery cell is selected by the host computer 50 running the algorithm. The cell ("target") is opened by assertion of the OPEN signal associated with the particular boundary, causing the corresponding multiplexer 12 to select as an input the IN bus associated with that boundary.

Next, in step 81, the cell is tested. If it is found to be operable, the algorithm advances to step 83. If, on the other hand, the cell is defective in some way, step 81 is followed by step 82, where a determination is made as to whether the just failed cell is the last peripheral cell of the wafer tested. If not, steps 80 and 81 are repeated until a workable cell is found. If no workable cell can be found at the periphery of the wafer, the wafer is determined to be bad, and the algorithm ends.

Assuming that steps 80 and 81 do find a peripheral cell that is operable, step 83 of the algorithm is performed: The "token" is advanced into that cell by setting the one of the latches 71-74 (FIG. 4A), corresponding to the cell's boundary entered, and signifying that the cell is now included in the chain by setting latch 75 to assert the CHAIN signal.

For example, with reference to FIG. 4B, which can be thought of as showing a portion 68 of a larger wafer, consisting of four cells A, B, C, and D, each structured in accordance with the teachings of the present invention, and oriented as discussed with respect to FIG. 2 (i.e., each cell is rotated 180 degrees relative to any neighboring cell). Assume the cell D has just been entered, tested, and found to be in working order by the steps 80 and 81. The token is advanced into the cell by setting the latch 73 to assert the NW signal, signifying that the chain being formed entered the boundary (here, W) counterclockwise adjacent to the NW corner of the cell D. The NW signal also signifies the next target cell: The cell adjacent the boundary is immediately clockwise from the NW corner.

The algorithm then sets the latch 75 to identify the cell D as now being part of the chain.

At step 84, a check is made to determine if the chain has progressed back to the host computer 50. If so, the algorithm is exited. If not, step 85 is performed to see if the next cell nominated for inclusion into the chain is, in fact, already in the chain (as indicated by the target cell's asserted CHAIN signal). For example, referring again to FIG. 4B, as indicated above, the target cell of the chain is now cell C. Before the OPEN signal into cell C is asserted, there is a check to determine if cell C's CHAIN signal is asserted. If so, and that border has previously been opened, step 85 is followed by step 83, and the token is advanced (setting the appropriate one of the latches 71-74 of the target cell). If not, however, since the target cell is in the chain, but the boundary between them is not open, no attempt is made to enter cell C. The algorithm will still return to step 83 where the token is advanced to the next one of the latches 71-75 of the cell D to identify the next boundary corner in order, NE. Thus, latch 73 is cleared and latch 74 set. The cell on the boundary clockwise adjacent the NE corner of the cell, cell A, is the new target cell.

Assume the cell C has not yet been made a part of the chain. Accordingly, the algorithm proceeds from step 85 to step 86 to open the target cell, cell C, by asserting the OPEN signal into the cell. Again, as described above, the OPEN signal causes the configuration logic 22 to operate the multiplexer 12 of cell C associated with the boundary between cells D and C to select the IN bus from cell D (FIG. 1). The algorithm now proceeds to test cell C at step 87. If the test fails, finding cell C to be defective in some way, the OPEN signal to cell C (generated by cell D) is deasserted in step 90, and a return to step 83 is made.

If, however, cell C passes, step 87 is left in favor of a return to step 83, where the token is advanced into cell C by setting the latch boundary just crossed, i.e., latch 72 of that cell, to assert the SW signal, and the CHAIN signal asserted by setting latch 75 of cell C. Steps 84 and 85 are performed as described above.

In this discussion, we will assume that the cells that are clockwise adjacent the SW and NW boundaries are unable to pass the test performed in step 87. Thus, after the token is first moved into cell C (step 83), steps 84, 85, 86, 87, and 90 will be performed once while latch 72 is set. The algorithm returns to step 83 to move the token to assert the NW signal, and steps 84–90 again performed, again to find the target inoperable. Once again the token is moved—to assert the NE signal, making cell B the target. Assuming the cell B to be good, step 87 will proceed back to step 83, and cell B will be included in the chain that is so far formed by cells D, C, and B.

The algorithm continues, until, as FIG. 2 illustrates, a return is made to a peripheral cell or the seminal cell (cell D in FIG. 4B, or cell 10J in FIG. 2), at which time the step 84 moves to the exit step, DONE.

Turning now to FIG. 5, there is illustrated an exemplary use of the cell architecture 10 (FIG. 1) in connection with a memory system forming the function logic 20. As FIG. 5 illustrates, a cell, designated generally with the reference numeral 110, is constructed in much the same way as that of FIG. 1, i.e., the cell 110 is provided four edge boundaries, north, . . . , west (N, . . . , W), separating it from its four adjacent neighbors. As in FIG. 1, each boundary N, . . . , W has associated therewith a corresponding one of the four two-input multiplexers 112N, . . . , 112W, respectively. One input of each of the multiplexers 112N, . . . , 112W receives a multi-bit input bus IN-N, . . . , IN-W, respectively, from the neighbor cell located at the associated boundary. As FIG. 5 further illustrates, each of the input busses IN-N, . . . , IN-W comprises 55 signal lines, carrying 39 bits of data (DATA), 11 bits of address (ADDR), four bits of instruction (INSTR), and a periodic clock (CLOCK) signal. Three of the multiplexers, 112N, 112E and 112W, couple their respective 55-bit outputs to a second input of the multiplexer associated with a clockwise adjacent boundary. The remaining multiplexer, 112S, has its 55-bit output coupled to logic circuit 116, where it is received by the input of a pipeline register configuration 118 that is clocked by the CLOCK signal. The logic circuit 116 (which corresponds to the logic circuit 16 in FIG. 1) includes, in addition to the pipeline register configuration 118, a dynamic random access memory configuration 140 of conventional design, a decode circuit 142 that is coupled to control logic, 144. Address registers 146 are also included, as is a shift/pass multiplexer 148.

The signalling produced by the control logic 144 directs operation of the cell in response to various instructions decoded by the decode logic 142. Thus, for example, the selected one of the latches 22 (e.g., 22W, FIG. 6) is set by signalling from the control logic and communicated to the configuration latches 122 which, in turn, causes another of the selection signals SEL-N, . . . , SEL-E to be asserted (in addition to the one asserted by the OPEN signal from the neighbor cell that caused this cell to be entered).

One particularly advantageous implementation of wafer scale integration is the promise it holds for solid state memory systems. Using a chain configuration, formed as hereinabove described, constructed of many similarly structured cells 110, carrying memory as illustrated in FIG. 5, a very high capacity memory architecture can be obtained. The DRAM 140 could very well be structured as an N by 39 bit word memory. However, 39 bit words are unusual. Therefor, it is more likely that the DRAM 140 configuration is N by M (N words, each M bits in length). If, however, the word length desired to be used is larger, for example, than M bits, the shift/pass multiplexer 148 can used.

For example, using the cell architecture of the present invention, together with a cell memory structure as shown is FIG. 5, a number of such cells 110 forming a wafer scale integrated circuit memory have the potential of providing immense storage capacity. If DRAM 140 is an N by 1 bit RAM, this configuration is best believed implemented by having each addressable (multi-bit) word spread across a number of cells 110. For this reason, the the shift/pass multiplexer 148 is used: In memory write operations, the shift/pass multiplexer 148 functions to strip the least significant bit (LSB) of the DATA word presented to that cell 110 for storage in the memory configuration 140. The shift/pass multiplexer 148 then shifts the remainder of the word down (moving the least next least significant bit (LSB+1) into the LSB position) before it is communicated to the next cell in the chain, where the same operation occurs.

The shift/pass multiplexer 148 functions in reverse when involved in a read operation: Access to the memory configuration 140 produces a single bit that is added to a word as it (the word) passes through the particular cell 110.

Operation of the cell 110, and the memory function is carries, generally is as follows: Parallel, multi-bit information, containing the 39 bits of data (DATA), 11 bits of address (ADDR) and 4 bits of instruction (INSTR), all accompanied by the periodic clock (CLOCK) signal, are applied to a chain formed by a number of cells 110, and sequentially applied to each cell in order. When applied to the cell 110, the information enters the pipeline register 118, and from there coupled to the memory system of function logic 120. The instructions, INSTR (e.g., read, write, etc.), are communicated to the decode register 142 where they are decoded for application to the control logic 144. At the same time, an address, ADDR, indicating the memory location to be accessed for a read or write operation is applied to the address register 146. Control logic 144 then operates to perform the access of the DRAM 140. In the case of a write, data appearing at the data input (DI) of the DRAM 140 is write to the specified memory location; and in the case of a read, the accessed data is coupled from the data output (DO) of the DRAM 140 to the output bus of the cell 110, OUT-W, via the signal lines 134. Depending upon how the cell 110 was configured by the configuration algorithm hereinabove described, the output of the logic circuit 116 will be communicated directly to the OUT-W output bus, as well as being conducted to the output busses OUT-W, N, E by the multiplexers 112W, 112N, or 112E, respectively. The cell next in order in the chain will be configured to have one of its multiplexers 112 set to select the connection to the output bus of this cell 110.

The address register structure 146 is used for configuring the address base of the DRAM 140 of the cell 110, relative to DRAMs that may be contained in other cells of a wafer-scale integrated array of cells 110 as described hereinabove. Address registers 146 may be set to specify the address boundaries of the address space implemented by the DRAM 140. Addresses for a read or write operation that are within this address space will cause the address register 146 to enable the control logic 144 to cause access of the DRAM 140. Conversely, addresses that are not within the address space specified by the address registers 146 will not be able to access the DRAM 140 of the particular cell 110. (Although another of the cells 110 in the hypothetical array will have this address within its address space specified by the address registers 146.)

In summary, there has been presented a description of an architecture of a cell for use in a wafer-scale integrated array of identically structured cells. That architecture contemplates selection apparatus formed on each cell, in connection with other logic circuitry, in such a way that the logic circuits of the various cells of the array can be logically interconnected by the connection apparatus to form a linear array or chain of such cells. When so formed there is a known, and minimum, delay formed between each logic circuit and the next one in the chain.

While a detailed explanation of the present invention has been presented, it should be evident to those skilled in the art that various modifications can be made. For example the configuration latches 71-75 can be replaced with fuses that perform the sample function, with the cells being tested by probed connections from the host, and the fused connections interrupted as a result of the test to configure each cell in the chain. Further, while the foregoing discussion has referred to an array of identically constructed cells, this need not be true to practice the present invention. For example, certain of the cells 10 may carry memory as the logic function 20, while others may carry arithmetic logic units, or other digital function. Also, the configuration may be made the subject of a number of modifications and variations. When a cell is entered during formation of the chain, all boundaries of that cell could be opened, and the first of the open boundaries found to separate that cell from another target cell becomes the one across which the token is advanced.

Finally, the discussion presented herein describes use of the invention for forming a linear array of cells from a wafer scale integrated array of such cells. While this is the best mode known of using the invention, it is by way of illustration only. As pointed out at the outset of this discussion, the invention is applicable to any array, and need not be necessarily confined to use in wafer scale integration.

What is claimed is:

1. A cell structure suitable for use in a cellular array, the cell being formed to have N boundaries, each boundary having an input bus means and an output bus means for respectively communicating signals into and out of the cell, each boundary being located between a first adjacent boundary and second adjacent boundary, the cell structure comprising:
   a plurality of selection means each associated with a corresponding one of the N boundaries, each selection means having inputs coupled to receive the input bus means and the output bus means of the associated boundary and a selection output, the selection output associated with N-1 of the boundaries being coupled to the output bus means of the corresponding first adjacent boundary, the selection means being operable to select between the input bus means and the output bus means;
   logic means coupled between an output of the remaining one of the N selection means and the output bus means of the corresponding first adjacent boundary, the logic means being configured and constructed to perform logic functions; and
   control means operably coupled to each of plurality of the selection means for causing selection of the corresponding input bus means or the output bus means for communication to the selection output of the selection means, the control means including first circuit means for asserting an OPEN signal for a first of the N boundaries, and second circuit means coupled to receive the OPEN signal and a neighbor OPEN signal from a neighbor cell structure across the first one of the N boundaries for causing the selection means associated with the first one of the N boundaries to select the corresponding input bus when the OPEN signal or the neighbor OPEN signal is asserted; whereby, communication may be established between the cell structure and the neighbor cell structure by the neighbor OPEN signal when the control means of the cell structure is itself unable to effect assertion of the OPEN signal.

2. The cell structure of claim 1, the control means including power-up means operable to cause each of the selection means to select the corresponding output bus means for communication to the selection output.

3. A plurality of integrated circuit cells of substantially identical construction formed on a semiconductor wafer, each of the cells being formed to have N boundaries, each boundary having input and output bus means for respectively receiving and communicating signals between the integrated circuit cell and a neighbor integrated circuit cell immediately across such boundary, the integrated circuit cell each further comprising:
   plural selection means, each associated with a corresponding one of the boundaries, and each having at least a pair of selection inputs coupled to receive the input bus means and the output bus means of the associated boundary and a selection output, the selection means being operable to select between the input bus means and the output bus means for communication to the selection output;
   logic means coupled between the selection output of a one of the selection means and the output bus means of a boundary adjacent the boundary with which the one selection means is associated, the remaining selection means having their selection outputs coupled to the output bus means of the boundary adjacent to the boundary associated with such remaining selection means, the logic means being configured and constructed to perform logic functions;
   control means operably coupled to each of the selection means for causing at each selection means selection of one of the selection inputs; and
   the control means including storage means for asserting an OPEN signal corresponding to a one of the N boundaries, and circuit means responsive to the OPEN signal, or another OPEN signal coupled to the control means from the neighbor integrated circuit cell immediately across the one boundary, to cause the selection means associated with the one boundary to select the corresponding input bus;
   whereby, communication may be established between the integrated circuit cell and the neighbor integrated circuit cell by the another OPEN signal when the control means of the integrated circuit cell is itself unable to assert the OPEN signal.

4. The plurality of integrated circuit cells of claim 3, wherein each of the integrated circuit cells is oriented so that opposing boundaries of the integrated circuit cell are rotated 180 degrees relative to any adjacent integrated circuit cell.

5. The plurality of integrated circuit cells of claim 4, the control means including power-up means operable to cause each of the selection means to select the corresponding output bus means for communication to the selection output.

6. The plurality of integrated circuit cells of claim 3, wherein each of the integrated circuit cells includes means for generating the OPEN signals, and means for communicating the generated OPEN signals to each neighboring integrated circuit cell.

7. The plurality of integrated circuit cells of claim 3, wherein the logic means includes memory means operating to store and retrieve data.

* * * * *